(12) United States Patent
Hoover

(10) Patent No.: US 12,265,767 B2
(45) Date of Patent: Apr. 1, 2025

(54) SYSTEM AND METHOD FOR ELECTRONIC CIRCUIT RESIMULATION

(71) Applicant: Steven F. Hoover, Shrewsbury, MA (US)

(72) Inventor: Steven F. Hoover, Shrewsbury, MA (US)

(73) Assignee: Steven Hoover, Shrewsbury, MA (US)

( * ) Notice: Subject to any disclaimer, the term of this patent is extended or adjusted under 35 U.S.C. 154(b) by 492 days.

(21) Appl. No.: 17/893,136

(22) Filed: Aug. 22, 2022

(65) Prior Publication Data

US 2023/0054303 A1    Feb. 23, 2023

Related U.S. Application Data

(60) Provisional application No. 63/235,289, filed on Aug. 20, 2021.

(51) Int. Cl.
| | | |
|---|---|---|
| *G06F 30/327* | (2020.01) | |
| *G06F 30/3308* | (2020.01) | |
| *G06F 30/367* | (2020.01) | |

(52) U.S. Cl.
CPC ........ G06F 30/327 (2020.01); G06F 30/3308 (2020.01); *G06F 30/367* (2020.01)

(58) Field of Classification Search
CPC ... G06F 30/327; G06F 30/3308; G06F 30/367
USPC ............................ 716/106, 105, 136; 703/14
See application file for complete search history.

(56) References Cited

U.S. PATENT DOCUMENTS

| | | | | |
|---|---|---|---|---|
| 7,085,703 | B2 * | 8/2006 | Gabele | G06F 30/33 703/22 |
| 7,428,486 | B1 * | 9/2008 | Casati | G06F 30/20 703/22 |
| 8,902,234 | B1 * | 12/2014 | Sanocki | G06F 30/20 345/473 |
| 8,903,698 | B2 * | 12/2014 | Walker | G06F 30/36 703/14 |
| 10,380,290 | B1 * | 8/2019 | Rasekh | G06F 30/367 |
| 2005/0273298 | A1 * | 12/2005 | Shah | G06F 30/367 703/2 |
| 2007/0074137 | A1 * | 3/2007 | Nishida | G06F 30/33 716/108 |

(Continued)

FOREIGN PATENT DOCUMENTS

| | | | | |
|---|---|---|---|---|
| CA | 2648257 C | * | 9/2013 | ............. E21B 44/00 |
| WO | WO-2012112195 A1 | * | 8/2012 | ......... G06F 17/5022 |

OTHER PUBLICATIONS

Jeong, et al. "A Time Division Multiplexing (TDM) Logic Mapping Method for Computational Applications", ICCSA 2007, LNCS 4705, Part I, pp. 1096-1106.

(Continued)

*Primary Examiner* — Phallaka Kik
(74) *Attorney, Agent, or Firm* — Pierce Atwood LLP

(57) ABSTRACT

A system and method allows resimulation of a portion of a model of an electronic circuit. The system and model may predict and cache data associated with the resimulation of the portion (e.g., the initial state and input signals associated with the portion) in a computer memory. If a request is received to resimulation the portion, the system and method may use the cached data to perform the resimulation.

8 Claims, 15 Drawing Sheets

(56) References Cited

U.S. PATENT DOCUMENTS

| | | | | |
|---|---|---|---|---|
| 2008/0140379 A1* | 6/2008 | Shah | ................... | G06F 30/367 |
| | | | | 703/14 |
| 2013/0311152 A1* | 11/2013 | Walker | ................ | G06F 30/367 |
| | | | | 703/4 |
| 2015/0100929 A1* | 4/2015 | Redekopp | ............ | G10L 19/032 |
| | | | | 716/103 |
| 2017/0091360 A1* | 3/2017 | Adaikalasamy | ...... | G06F 30/331 |

OTHER PUBLICATIONS

Hoover, et al. "Top-Down Transaction-Level Design with TL-Verilog", Nov. 5, 2018, arXiv:1811.01780.

Hoover, "Timing-Abstract Circuit Design in Transaction-Level Verilog", 2017 IEEE International Conference on Computer Design (ICCD), 2017, pp. 525-532, doi: 10.1109/ICCD.2017.91.

D. Rosenband, J. Schwartz and Arvind, "Modular scheduling of guarded atomic actions", 41st Design Automation Conference (DAC), 2004.

F. Gruian and M. Westmijze, "VHDL vs. Bluespec system verilog: a case study on a Java embedded architecture", Proc. of the 2008 ACM Symposium on Applied Computing, pp. 1492-1497, Mar. 2008.

J. Bachrach et al., "Chisel: Constructing Hardware in a Scala Embedded Language", Proc. of the 49th Design Automation Conference, Jun. 2012.

C. E. Leiserson, F. Rose and J. B. Saxe, "Optimizing synchronous circuitry by retiming", Proc. of the 3rd Caltech Conference on VLSI, Mar. 1983.

B. Lockyear and C. Ebeling, "Optimal Retiming of Multi-Phase Level-Clocked Circuits", Advanced Research in VLSI and Parallel Systems: Proc. of the Brown/MIT Conference, pp. 265-280, 1992.

E. Nurvitadhi, Automatic Pipeline Synthesis and Formal Verification from Transactional Datapath Specifications, 2010.

* cited by examiner

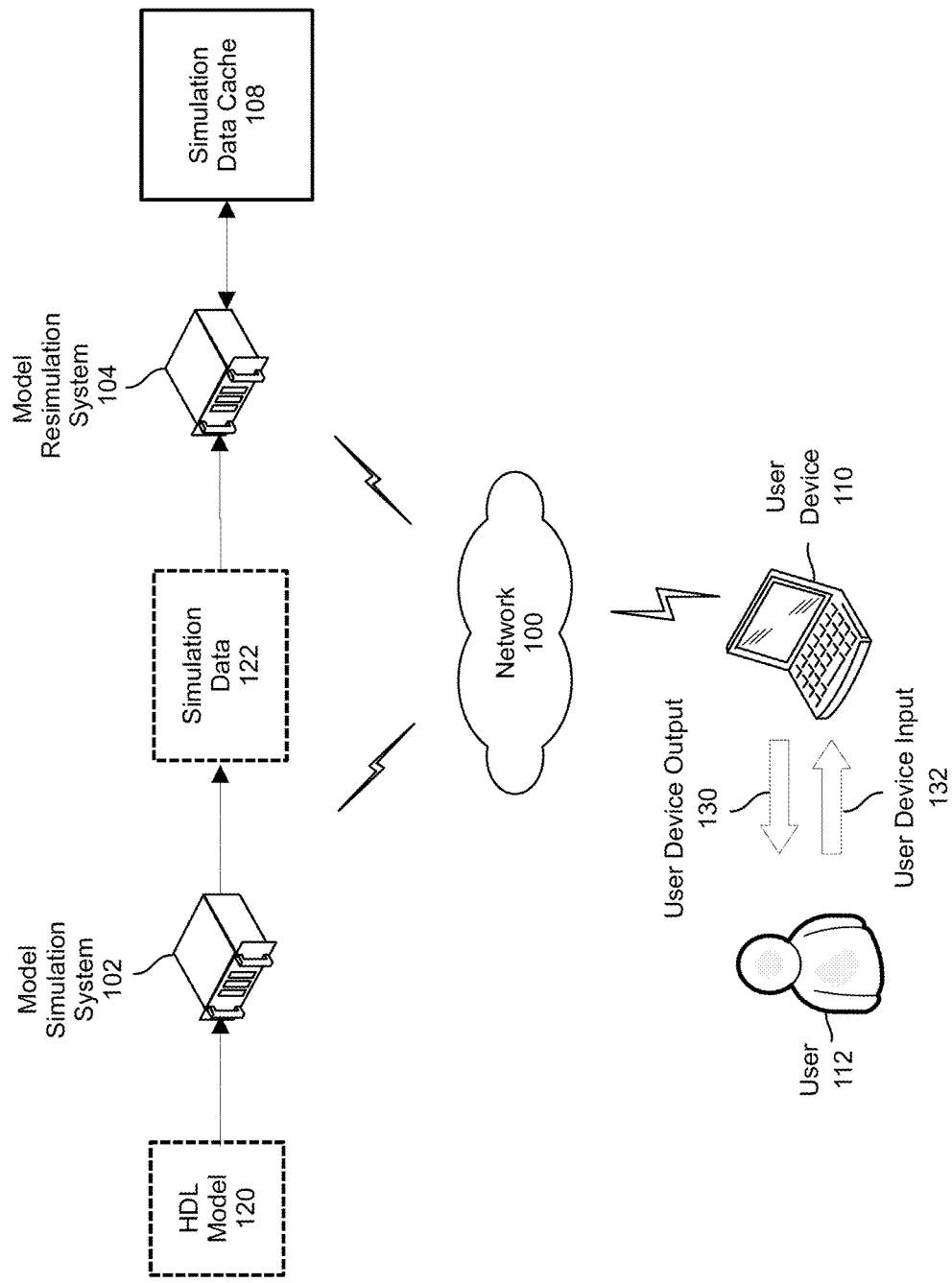

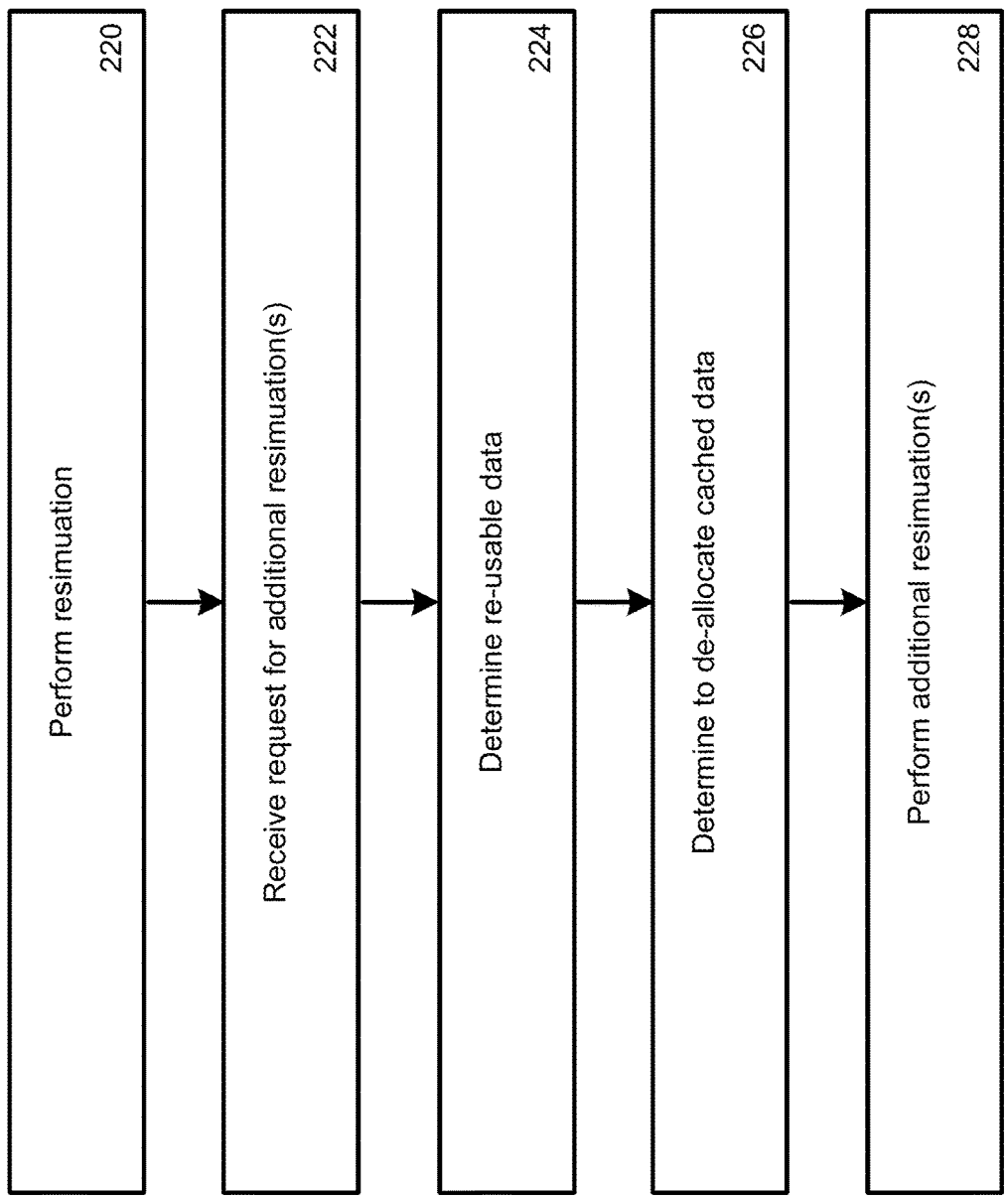

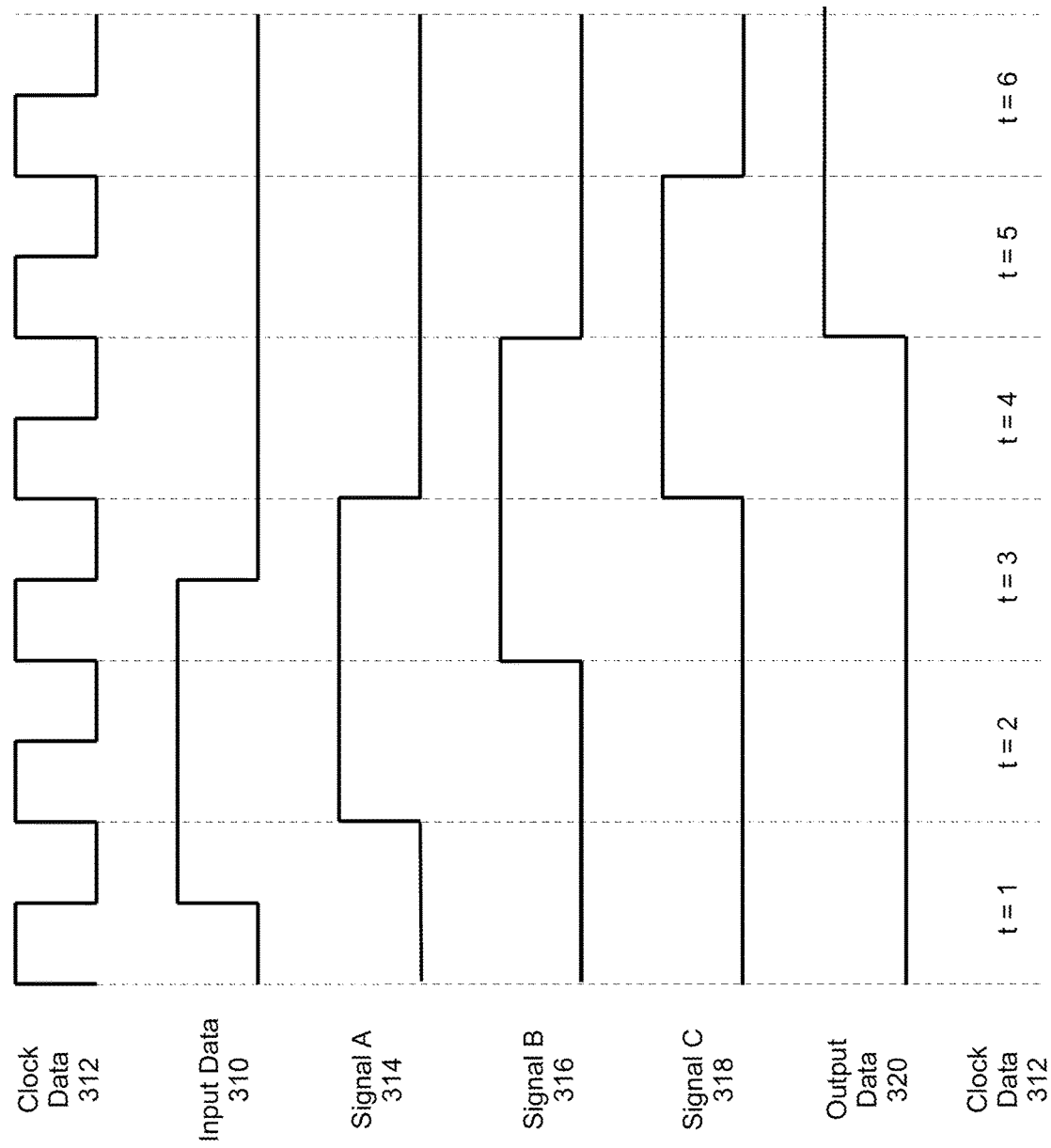

FIG. 3C

Simulation Data 340

| | Time Step 1 340a | Time Step 2 340b | Time Step 3 340c | Time Step 4 340d | Time Step 5 340e | Time Step 6 340e |
|---|---|---|---|---|---|---|
| Time Data 330 | 1 | 2 | 3 | 4 | 5 | 6 |
| Input Data 310 | 1 | 1 | 0 | 0 | 0 | 0 |
| Signal A 314 | 0 | 1 | 1 | 0 | 0 | 0 |
| Signal B 316 | 0 | 0 | 1 | 1 | 0 | 0 |
| Signal C 318 | 0 | 0 | 0 | 1 | 1 | 0 |
| Output Data 320 | 0 | 0 | 0 | 0 | 1 | 1 |

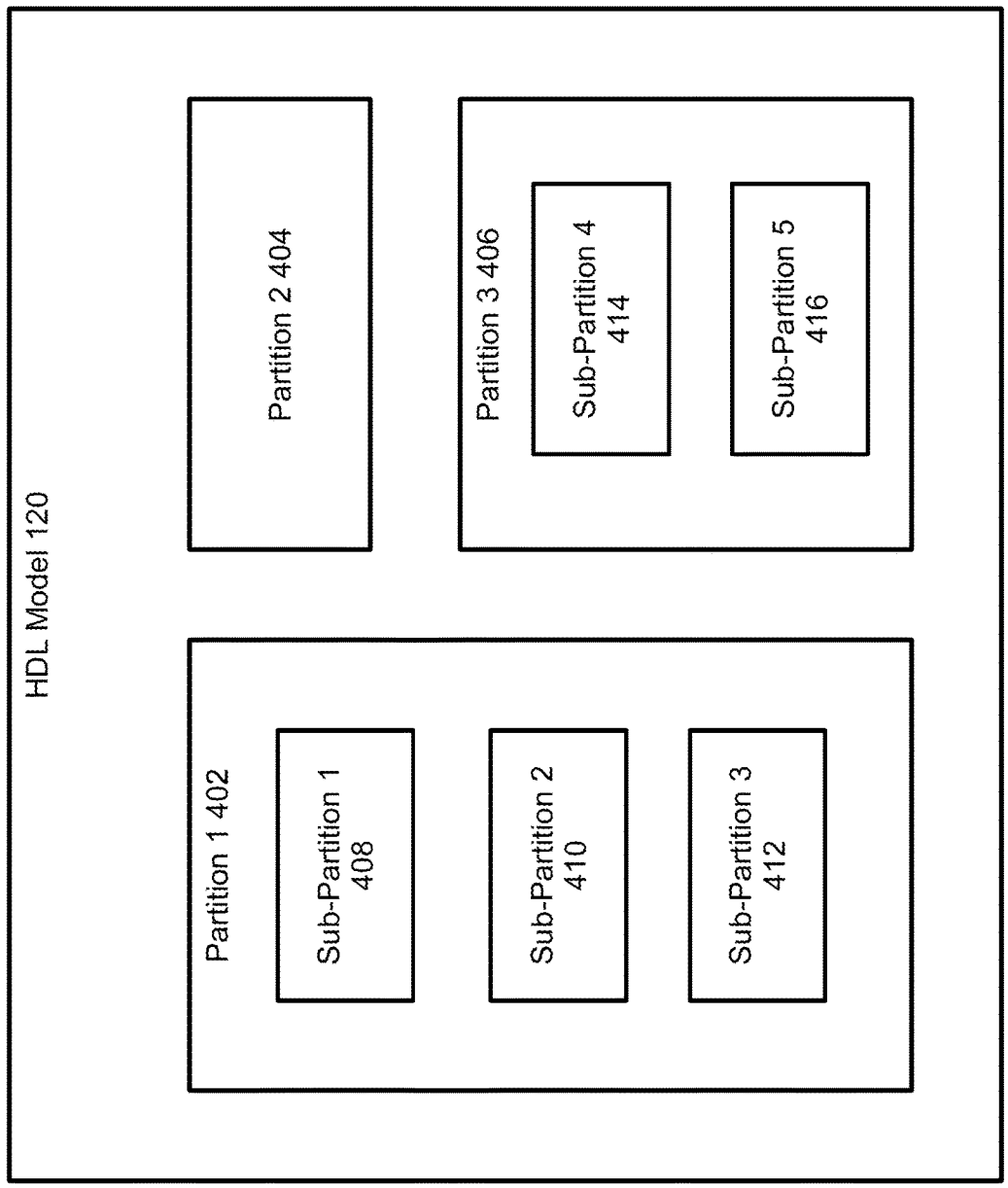

FIG. 5

Simulation Data 500

| | | Time Step 1 420a | Time Step 2 420b | ... | Time Step N 420n |
|---|---|---|---|---|---|
| Partition 1 402 | Sub-Partition 1 408 | Signal Value Data 508a | Signal Value Data 508b | ... | Signal Value Data 508n |
| | Sub-Partition 2 410 | Signal Value Data 510a | Signal Value Data 510b | ... | Signal Value Data 510n |
| | Sub-Partition 3 412 | Signal Value Data 512a | Signal Value Data 512b | ... | Signal Value Data 512n |
| Partition 2 404 | | Signal Value Data 504a | Signal Value Data 504b | ... | Signal Value Data 504n |
| Partition 3 406 | Sub-Partition 4 414 | Signal Value Data 514a | Signal Value Data 514b | ... | Signal Value Data 514n |
| | Sub-Partition 5 416 | Signal Value Data 516a | Signal Value Data 516b | ... | Signal Value Data 516n |

HDL Model 120

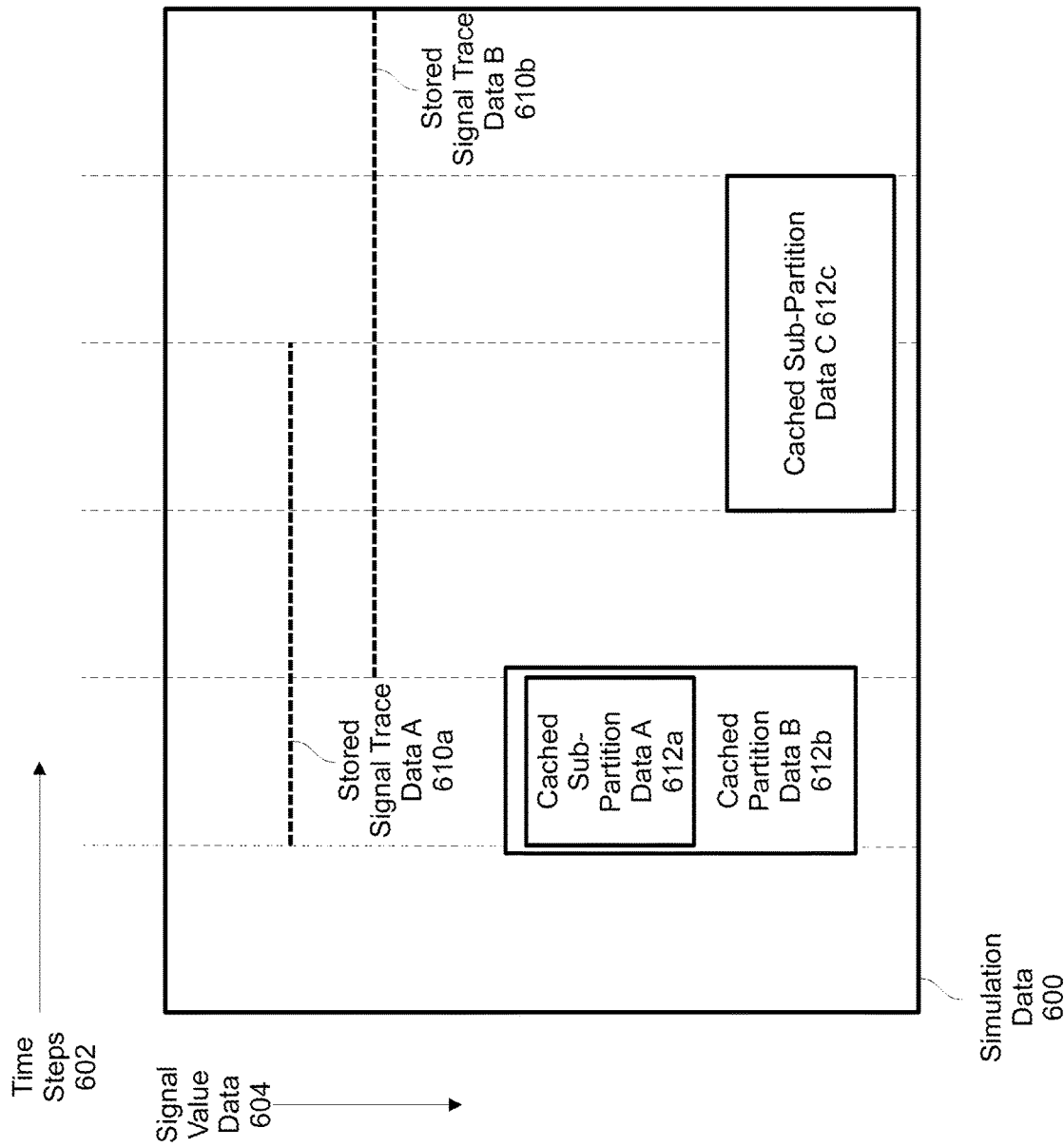

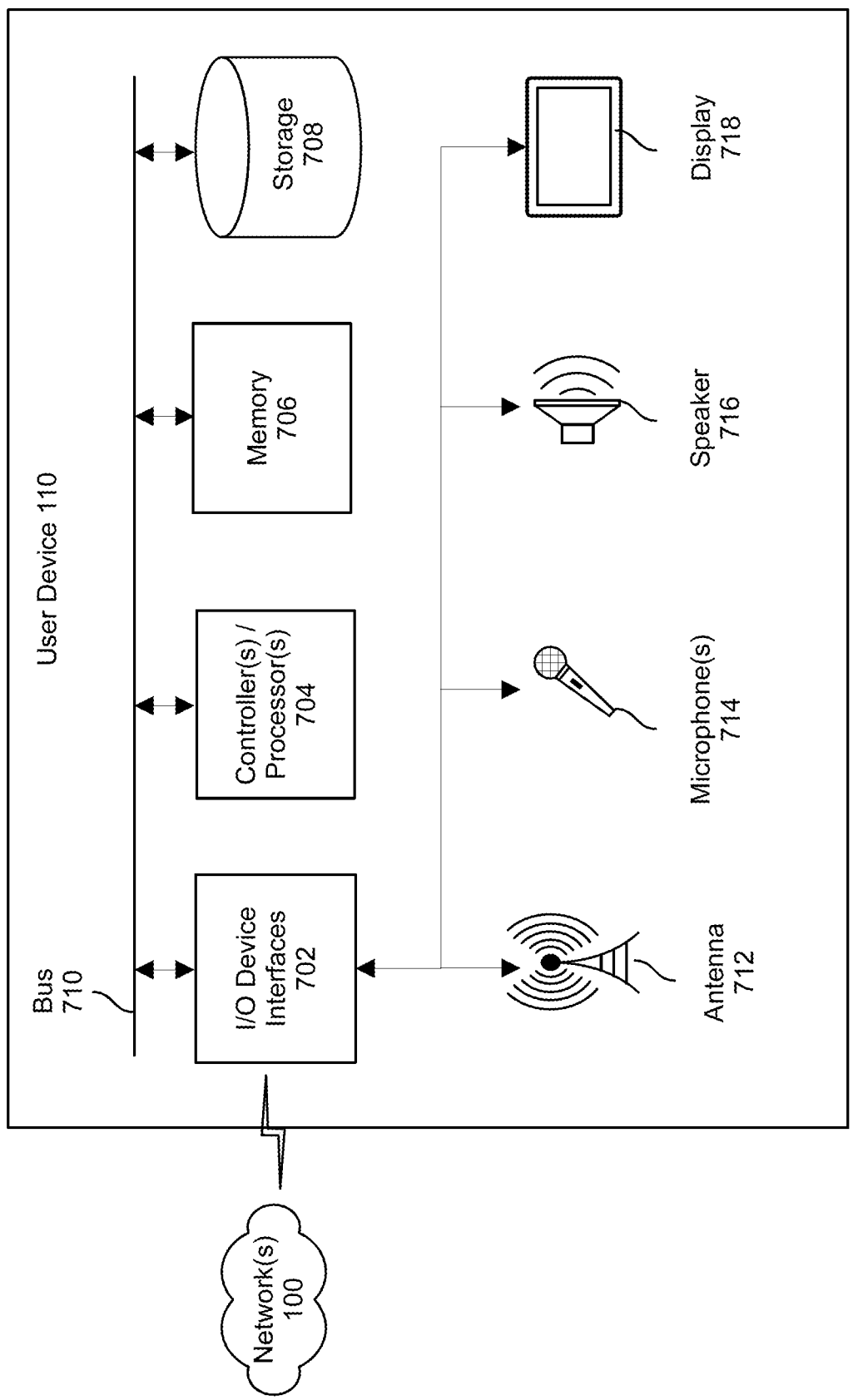

SYSTEM AND METHOD FOR ELECTRONIC CIRCUIT RESIMULATION

CROSS-REFERENCE TO RELATED APPLICATIONS

This application claims priority to and the benefit of, and incorporates by reference herein in its entirety, U.S. Provisional Patent Application Ser. No. 63/235,289, filed Aug. 20, 2021, in the name of Steven F. Hoover.

BACKGROUND

A design of an electronic circuit, such as a microprocessor, application-specific integrated circuit (ASIC), or any other such circuit, may be designed by first describing it using a hardware-description language (HDL), such as the Very-High-Speed Hardware-Description Language (VHDL). The HDL description may be verified for correct operation by using it to create a computer model of the electronic circuit and simulating operation of the electronic circuit by executing the model. The simulation may be tested by applying patterns of signals to inputs of all or part of the simulation and by observing its corresponding output signals.

BRIEF DESCRIPTION OF DRAWINGS

For a more complete understanding of the present disclosure, reference is now made to the following description taken in conjunction with the accompanying drawings.

FIGS. 1A and 1B illustrate an exemplary system for resimulating a portion of an HDL model of an electronic circuit according to embodiments of the present disclosure.

FIGS. 2A and 2B illustrate methods for resimulating a portion of an HDL model of an electronic circuit according to embodiments of the present disclosure.

FIGS. 3A-3C illustrate simulating and storing information related to an HDL model according to embodiments of the present disclosure.

FIGS. 4A and 4B illustrate partitioning an HDL model of an electronic circuit according to embodiments of the present disclosure.

FIG. 5 illustrates data generated by simulation of a partitioned HDL model according to embodiments of the present disclosure.

FIGS. 6A and 6B illustrate predicatively caching simulation data according to embodiments of the present disclosure.

FIGS. 7, 8, and 9 illustrate computers and networks for resimulating an HDL model of an electronic circuit according to embodiments of the present disclosure.

DETAILED DESCRIPTION

Figure 1B:
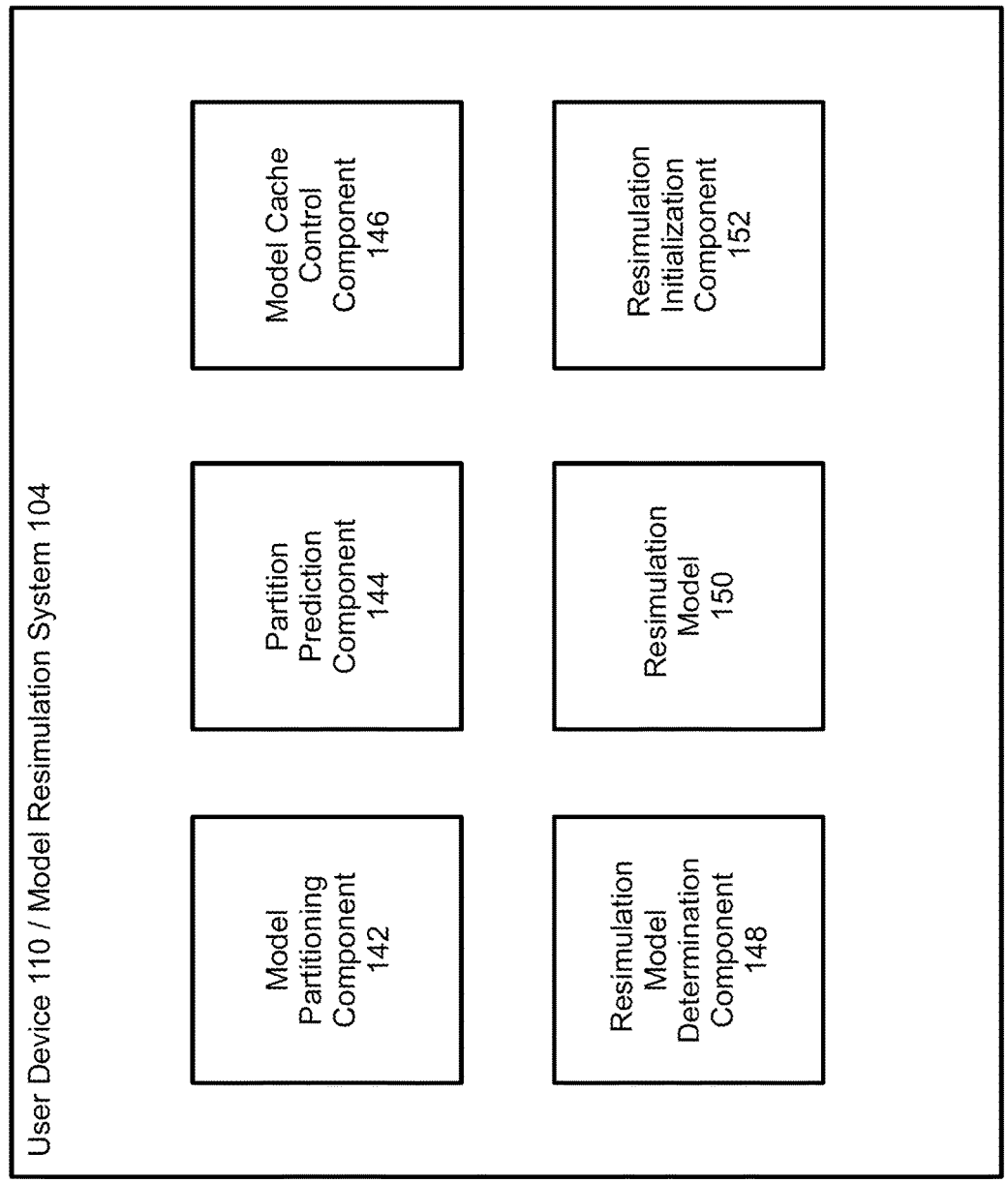

The present disclosure relates to software-based simulation of a hardware-description language (HDL) model of an electronic circuit, such as a microprocessor, application-specific integrated circuit (ASIC), or any other such circuit. In a circuit-design process, the HDL model may be determined first, and one or more computer simulations of the HDL model may thereafter be run to identify errors therein. During this simulation process (e.g., "debugging" or "verification"), histories or "traces" of predetermined signal values may be captured over time thereafter reviewed for correctness. This capturing of trace data may, however, significantly reduce simulation speed and/or consume significant storage. Verification engineers may thus make tradeoffs between simulation speed and visibility when choosing what to capture in traces. When the necessary data is not available, engineers may reconfigure trace capture, identify new signals of interest, and rerun simulations, sometimes iterating multiple times to isolate an error in the HDL model.

Embodiments of the present disclosure thus relate to using one or more of the techniques described herein to resimulate at least a portion of the HDL model to provide verification engineers with information regarding the values of signals in the simulation without the need to rerun the entire simulation. As described in greater detail below, portions of the HDL model of likely future interest to the verification engineer may be predicted and, during a simulation, data corresponding to those portions may be stored in a computer cache memory. If one of these portions is indicated to be of future interest, this cached data may be used to resimulate the desired portion without the need to resimulate the entire HDL model or otherwise require resimulation of parts of the HDL model outside the determined portion.

Referring first to FIG. 1A, a model-simulation system 102 may process an HDL model 120 (which describes an electronic circuit to be tested) to determine simulation data 122. The HDL model 120 may be determined by processing HDL code describing an electronic circuit such that applying sequences of input data ("test patterns") to the HDL model 120 simulates operation of the electronic circuit. The test patterns may be determined by a user 112 via user device input 132 to a user device 110. The user device 110 may communicate with the model-simulation system 102 via a network 100. The simulation data 122 may include indications of one or more signals in the HDL model 120 (e.g., chip outputs, combinatorial logic inputs or outputs, storage elements inputs or outputs, etc.). Each signal may be associated with a given time period of execution of the HDL model 120 (referred to herein as a "time step").

The model-simulation system 102 may thus determine simulation data 122 corresponding to the processing of input data by the HDL model 120. The simulation data 122 may represent the output of the HDL model 120 after processing a number N of time steps. These time steps may be determined by a clock signal (e.g., a square-wave signal that controls how storage elements, such as flip-flops, within the HDL model 122 process data). The storage elements may, for example, capture a value of a signal appearing on their inputs and propagate that value to their outputs upon detection of a rising edge of the clock signal. Any similar method of dividing simulation time into time steps (e.g., using latches in lieu of flip-flops, and using any other timing signal) is within the scope of the present disclosure.

As explained in greater detail below, however, with respect to FIGS. 3A-3C, the simulation data 122 does not include the value of every signal in the simulation for every time step. Because the HDL model 120 may include up to millions of signal values over thousands of time steps (or more), storing all of this simulation data 122 may be impossible (due to finite storage available) or impractical (due to the slowdown to simulation speed required to store this data). The user 112 may thus indicate a small subset of signals in the HDL model 120 of interest to the user 112, and the model-simulation system 102 may store only these values of the small subset of signal values (referred collectively to herein as a signal "trace") over an indicated time period. The user device 110 may thereafter be configured to display the values of this subset of signals via the user-device output 130; if, however, the user 112 wishes to view the values of other signals, the model-simulation system 102 must rerun the simulation to save and/or display those values.

In accordance with embodiments of the present disclosure, a model resimulation system 104 may predict that portions of the HDL model 120 (referred to herein as "partitions" or "sub-partitions") are likely to be of future interest to the user 112 and may cache, in a simulation data cache, data corresponding to those portions. If the user 112 then later indicates, via user device input 132, a request to view data corresponding to those portions, the model-resimulation system 104 may determine a small model corresponding to only those portions (and/or associated circuitry) and, using the data in the simulation data cache 108, resimulate only those portions. In some embodiments, the model-resimulation system 104 may further cache data for and resimulate further portions of the HDL model 120 corresponding to higher levels of hierarchy.

The simulation data cache 108 may be any storage structure, and the present disclosure is not limited to any particular type of cache and/or memory. The simulation data cache 108 may be, for example, a dedicated hardware data cache. The simulation data cache 108 may be, instead or in addition, any storage space implemented in hardware and/or software. The simulation data cache 108 may be, for example, an allocation of computer memory.

Figure 8:
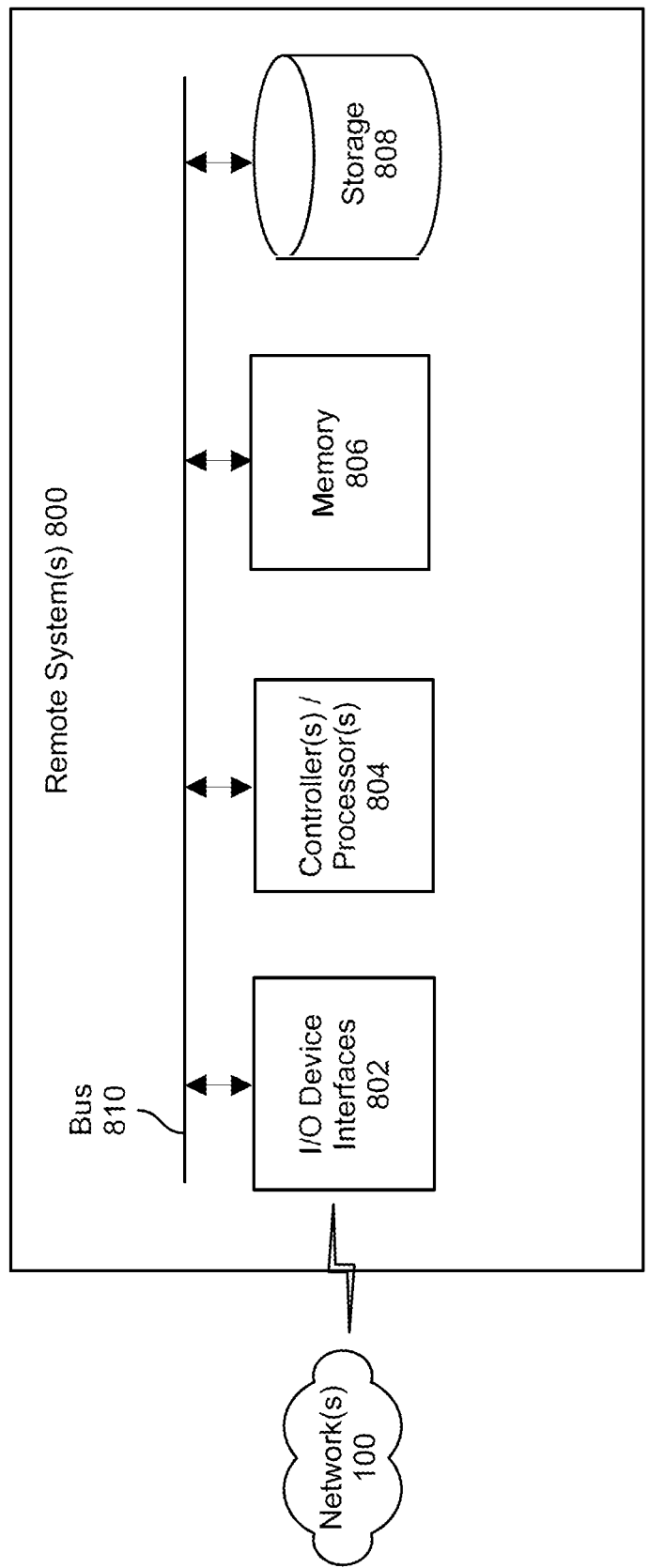
Figure 9:
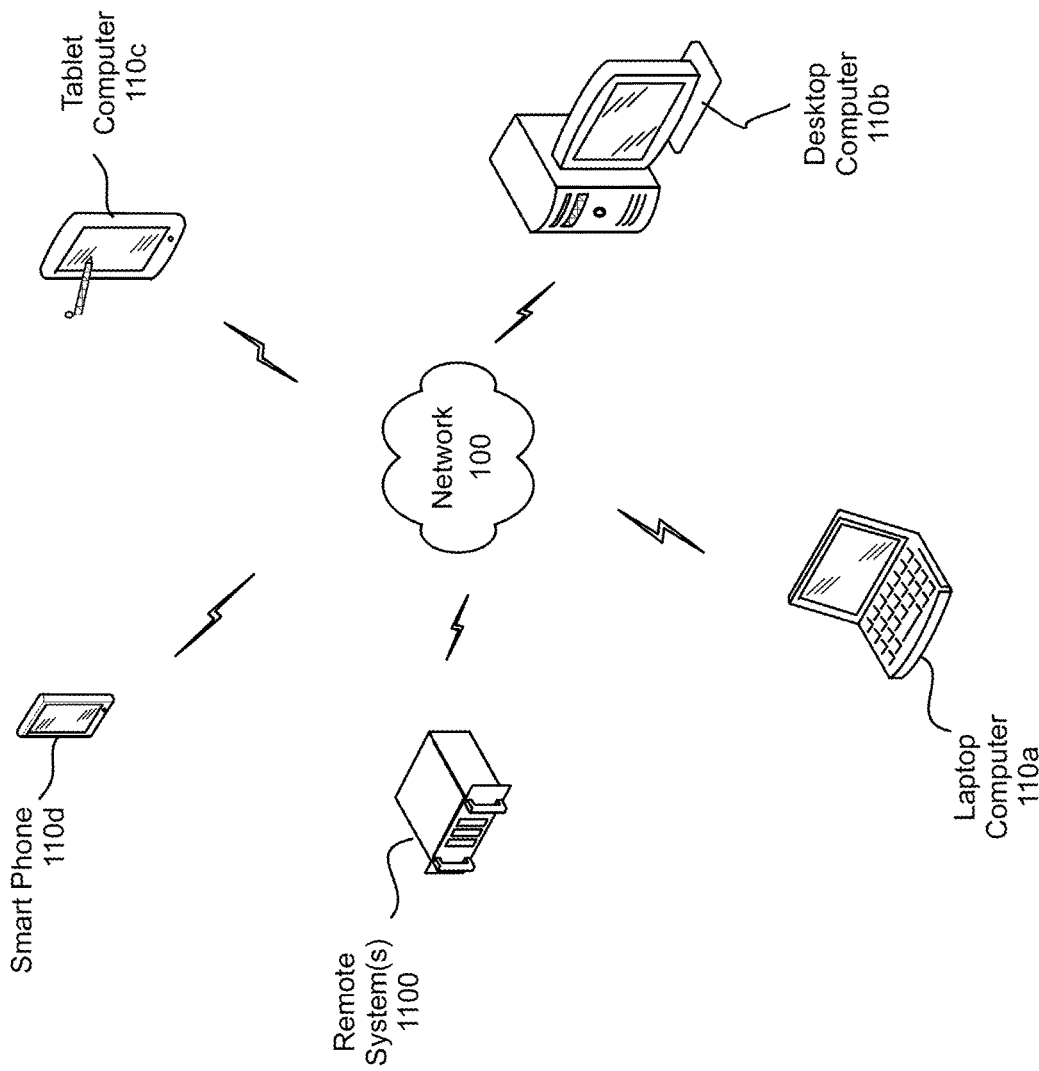

Any number of user devices 110 and users 112 may so communicate with the systems 102, 104. The systems 102, 104 may be disposed on one or more remote systems 800, as shown in FIG. 8 and FIG. 9. Input data 132 may specify the behavior of input signals, such at which times a particular input signal is represented by a logical "0" or a logical "1." Operation of the systems 102, 104 may include applying the values of specified input signals to one or more elements of the systems 102, 104, determining the outputs of those elements, and similar processing of those outputs by additional elements. Any simulation data 122 may be displayed on a display of the user device 110 and/or stored in computer data, such as a text data file and/or trace data file. The systems 102, 104 may be interactive, and may simulate only portions of the model 120 and/or only certain periods of time of operation of the model 120 per user (and/or other) control input.

Waveform viewers of the user device 110 may be used to represent the simulation data 122, such as signal values, as signal waveforms. Waveform viewers may be categorized as timeline views, where time is represented on one of the two axes of the two-dimensional display, and the state of the model is represented on the other axis. A state view may be used to represent machine state at a point in time. State viewers may provide interactive controls to allow a user to adjust which period of time is displayed. In synchronous logic, controlled by a clock, time may be expressed discretely as clock cycles. Timeline views and state views are not a mutually exclusive categorization. More generally, state views may represent a window of time in the neighborhood of a reference time. A timeline view with a reference time, such as a waveform view with a cursor (vertical line at the reference time), can also be considered a state view.

FIG. 1B illustrates a number of software components of the model-resimulation system 104 relevant to the present disclosure. Some or all of the components may instead or in addition be disposed on the user device 110. Other components of the user device 110 and model-resimulation system 104 are illustrated in FIGS. 7 and 8; one of skill in the art will understand that the user device 110 and model-resimulation system 104 may contain still other components.

A model-partitioning component 142 may process the HDL model 120 to determine two or more partitions, sub-partitions, sub-sub-partitions, etc., each with corresponding partition boundaries and associated groups of circuit elements. A partition may contain two or more sub-partitions, a sub-partition may contain two or more sub-sub-partitions, and so on. The model-partitioning component 142 may determine the partitions, sub-partitions, and/or sub-sub-partitions (collectively referred to henceforth as "partitions") by, for example, determining functional block boundaries in the HDL model 120 and associating the partitions therewith. For example, an execution unit of a computer processor may be associated with a partition, multiple parallel execution pipelines of the execution unit may be associated with sub-partitions, and multipliers of the execution pipelines may be associated with sub-sub-partitions.

A partition-prediction component 144 may predict, using one or more techniques described herein, which partitions are likely candidates for future resimulation. One such technique involves processing the set of signals in a signal trace requested by the user 112. The partition-prediction component 144 may, for example, determine for each partition a number of signals therein that are part of signal traces. The partition-prediction component 144 may then rank the partitions by number of signal traces in each and select the top-N partitions for caching. The partition-prediction component 144 may further perform a similar ranking of signals that are inputs to the signal-trace signals and may include such signals in the ranking.

The partition-prediction component 144 may similarly predict a partition to be selectively cached based at least in part on the interaction of the user 112 and/or the user device 110. The user device 110 may, for example, implement one or more debugging tools that allow the user 112 to review the results of the simulation data 122. The partition-prediction component 144 may monitor the interaction of the user 112 and compile data corresponding to signals identified during such interaction. The partition-prediction component 144 may similarly compile a top N-list of most-interacted signals (and corresponding partitions) and determine which partitions to select as candidates for caching based thereon.

The partition-prediction component 144 may further select partitions as candidates for caching based on a physical proximity to an already-determined partition or partitions. If, for example, a determined partition exists at a level a hierarchy in proximity to similar partitions, the partition-prediction component 144 may determine to cache data associated with the similar partitions. As discussed herein, the partition-prediction component 144 may further determine to cache data associated with a higher or lower level of hierarchy of a determined partition.

The partition-prediction component 144 may instead or in addition monitor the user device 110 and determine which, if any, partitions and/or signals are of interest to the user 112. The user device 110 may, for example, include a waveform viewer (and/or other such debug tools) or similar software application and may monitor the interaction of the user 112 with said application.

A model-cache control component 146 may store, in the simulation data cache 108, simulation data associated with a predicted partition. Details of the model-cache control component 146 are explained in greater detail below with respect to FIGS. 3A-3C and FIGS. 4A, 4B, 5, 6A, and 6B.

A resimulation model-determination component 148 may determine a resimulation model 150 that includes one or more of the predicted partitions; the model may further include other models of, for example, sub-partitions.

A resimulation initialization component 152 may apply appropriate values from the simulation data cache 108 (e.g., initial state values and/or input values) to the resimulation model 150.

Figure 2A:
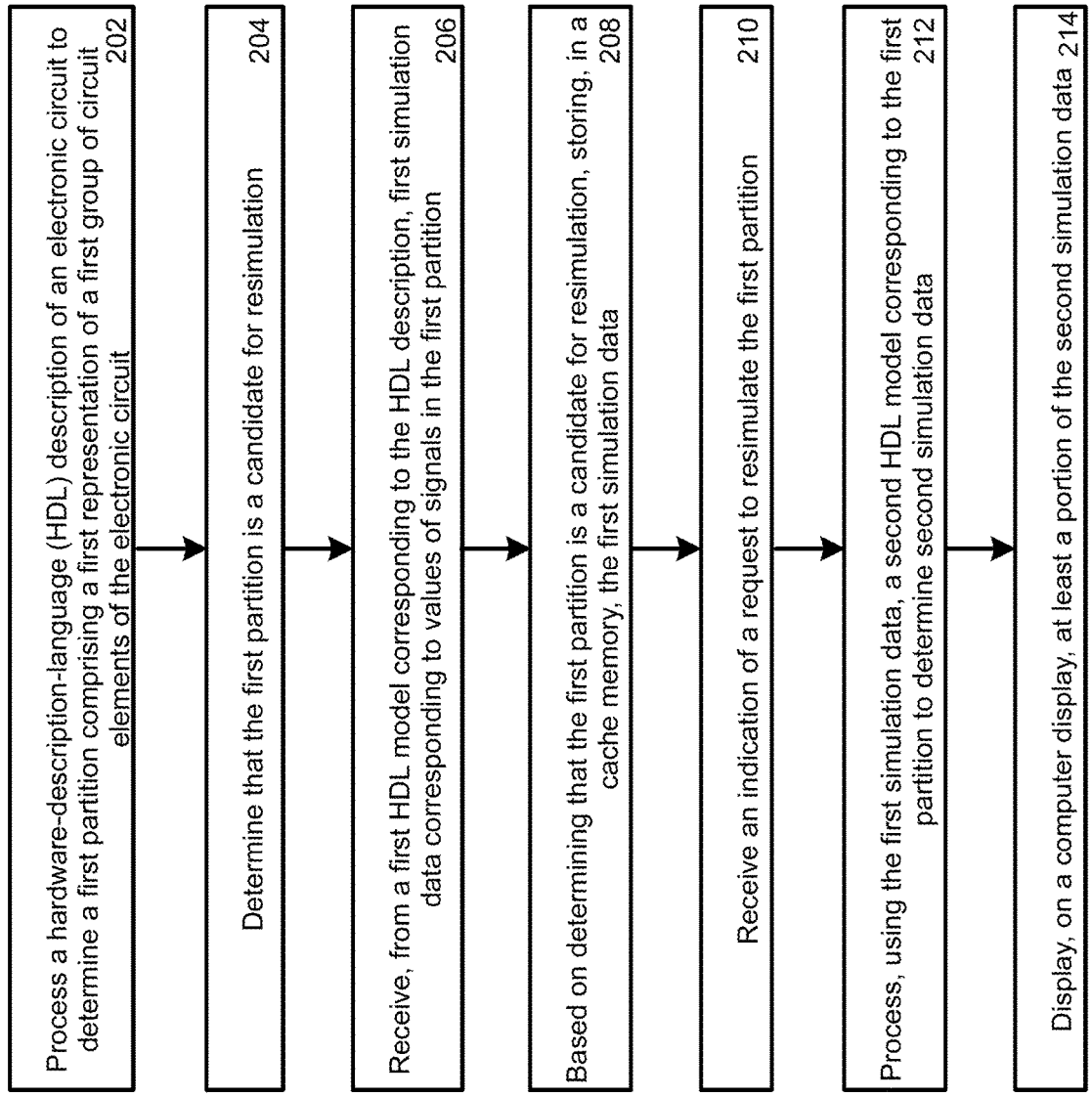

FIGS. 2A and 2B illustrate methods of resimulation in accordance with embodiments of the present disclosure. Referring first to FIG. 2A, the model-resimulation system 104 may process (202) a hardware-description-language (HDL) description of an electronic circuit to determine a first partition comprising a first representation of a first group of circuit elements of the electronic circuit. The model-resimulation system 104 may then determine (204) that the first partition is a candidate for resimulation. The model-resimulation system 104 may receive (206), from a first HDL model corresponding to the HDL description, first simulation data corresponding to values of signals in the first partition. Based on determining that the first partition is a candidate for resimulation, the model-resimulation system 104 may store (206), in a cache memory, the first simulation data. If and/or when the model-resimulation system 104 receives (210) an indication of a request to resimulate the first partition (from, e.g., the user device 110), the model-resimulation system 104 may process (212), using the first simulation data, a second HDL model corresponding to the first partition to determine second simulation data. The model-resimulation system 104 may then cause the user device 110 to display (214), on a computer display, at least a portion of the second simulation data.

In other embodiments, the model-resimulation system 104 may weigh other factors to select one or more partitions for caching. For example, the model-resimulation system 104 may collect data across a number of users 112 to determine which, if any, partitions are of interest to a particular user 112 and may cache data associated with similar partitions for a different user 112. The model-resimulation system 104 may further determine which, if any, particular partitions are requested for resimulation by a user 112 but were not candidates for caching and may, for other users 112, determine to cache the said partitions.

Referring to FIG. 2B, the model-resimulation system 104 may process further iterations of resimulation. In a first step (220), the model-resimulation system 104 may perform a resimulation as described herein. In a second step (220), the model-resimulation system 104 may receive, from the user 112 via the user device 110, a request to resimulate one or more other partitions. The model-resimulation system 104 may then, in a third step (224), determine if any already-determined data may be re-used to perform the resimulation. For example, if a sub-partition has already been resimulated, a parent partition may re-use some or all of said data. In a fourth step (226), the model-resimulation system 104 may determine to de-allocate some or all of the data cached in the cache 108. If, for example, a partition is not of interest to the user 112, any or all storage space in the cache 108 may be de-allocated. In one or more steps (228), some or all of the model 120 may be re-simulated.

Figure 3A:
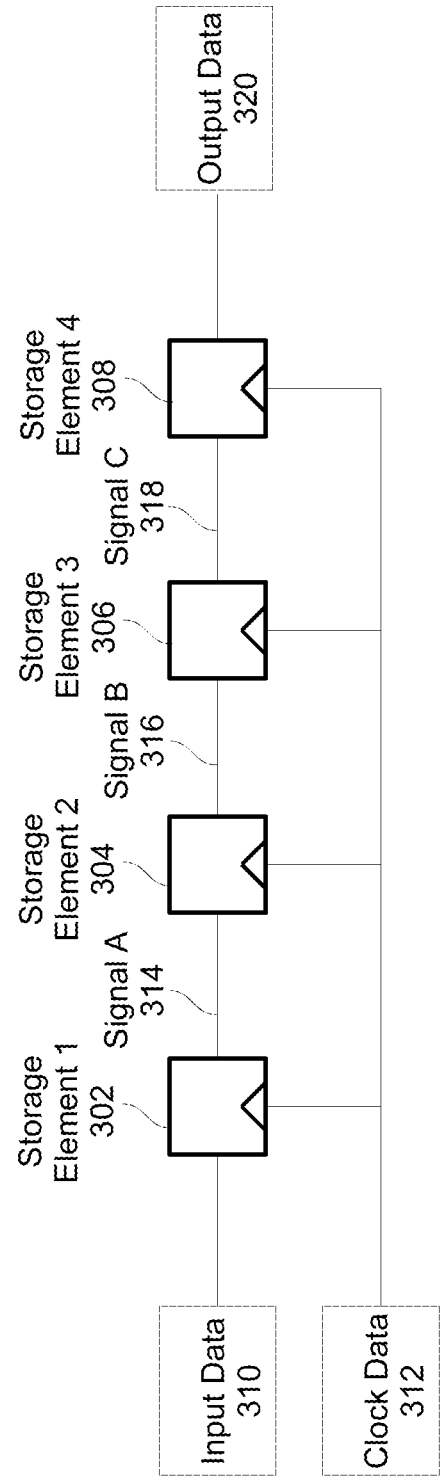

FIGS. 3A-3C illustrate simulating a model and capturing data therefrom in accordance with embodiment of the present disclosure. Referring first to FIG. 3A, a simulation environment includes input data 310 (provided by, e.g., the user 112 via the user device 110) received by a sequence of storage elements 302, 304, 306, 308 (e.g., flip-flops) to determine output data 320. The storage elements 302, 304, 308 determine output signals A, B, C 314, 316, 318. The storage elements are also provided clock data 312 (e.g., a square-wave clock signal). In this illustrative example, the input data 310 propagates through the storage elements 302, 304, 306, 308 as determined by the clock signal. This example is shown for illustrative purposes only; any such simulation environment including any number of circuit elements (e.g., combinational logic, further flip-flops, FIFOs, queues, memories, etc.) is within the scope of the present disclosure, which is not limited to only this simulation environment.

FIG. 3B illustrates waveforms resulting from the application of input data 310 and the resultant signals 314, 316, 318 determined by the storage elements 302, 306, 308. In this example, the simulation environment is executed over six time periods of the clock data 312 (t=1 . . . t=6). For example, at the beginning of the second time period t=2, the input to the first storage element 302 (e.g., the input data 310) is high, so the first storage element 302 captures the high value, and the output of the first storage element 302, signal data 314, is also high during the second time period t=2. At the beginning of the fourth time period t=4, the input to the first storage element 302 is low, so the first storage element 302 captures the low value, and the signal data 314 also becomes low. The input data 310 propagates through the rest of the storage elements 304, 306 on a one-cycle delay as shown.

Referring to FIG. 3C, simulation data 340 is shown; the time data appears on the x-axis and the signal names appear on the y-axis. The simulation data 340 may correspond to the data produced by the model-simulation system 102 and captured in the simulation data 122. That is, instead of the signal waveforms depicted in FIG. 3B, the simulation data 122 may include signal names (or other such signal identifiers) and the values of signals during the time steps. For example, in FIG. 3B, the value of signal A 314 during time step t=2 is depicted as "high"; in FIG. 3C, that data is represented by a "1" value for signal A 314 in the column for time step t=2 340*b*. The values of the other signals during the other time steps 340*a*-340*e* is similarly depicted.

Because the illustrated exemplary simulation environment contains few components, the result of the entire simulation may be stored in the simulation data 122. In practice, however, an actual design under test may be simulated for thousands of time steps and may contain millions of signals. The storage of all of these values over all of the time steps is thus impossible, as mentioned above. Instead, the values of signals of each time step are used merely as inputs into the next time step; once the values corresponding to that time step are determined, the values of the signals corresponding to the previous time step are discarded. For example, once the values of the signals of time step 3 340*c* are determined, the values of the signals of time step 2 340*b* are discarded. The only signal values that may be retained are those signals explicitly listed in a predetermined signal trace.

Figure 4B:
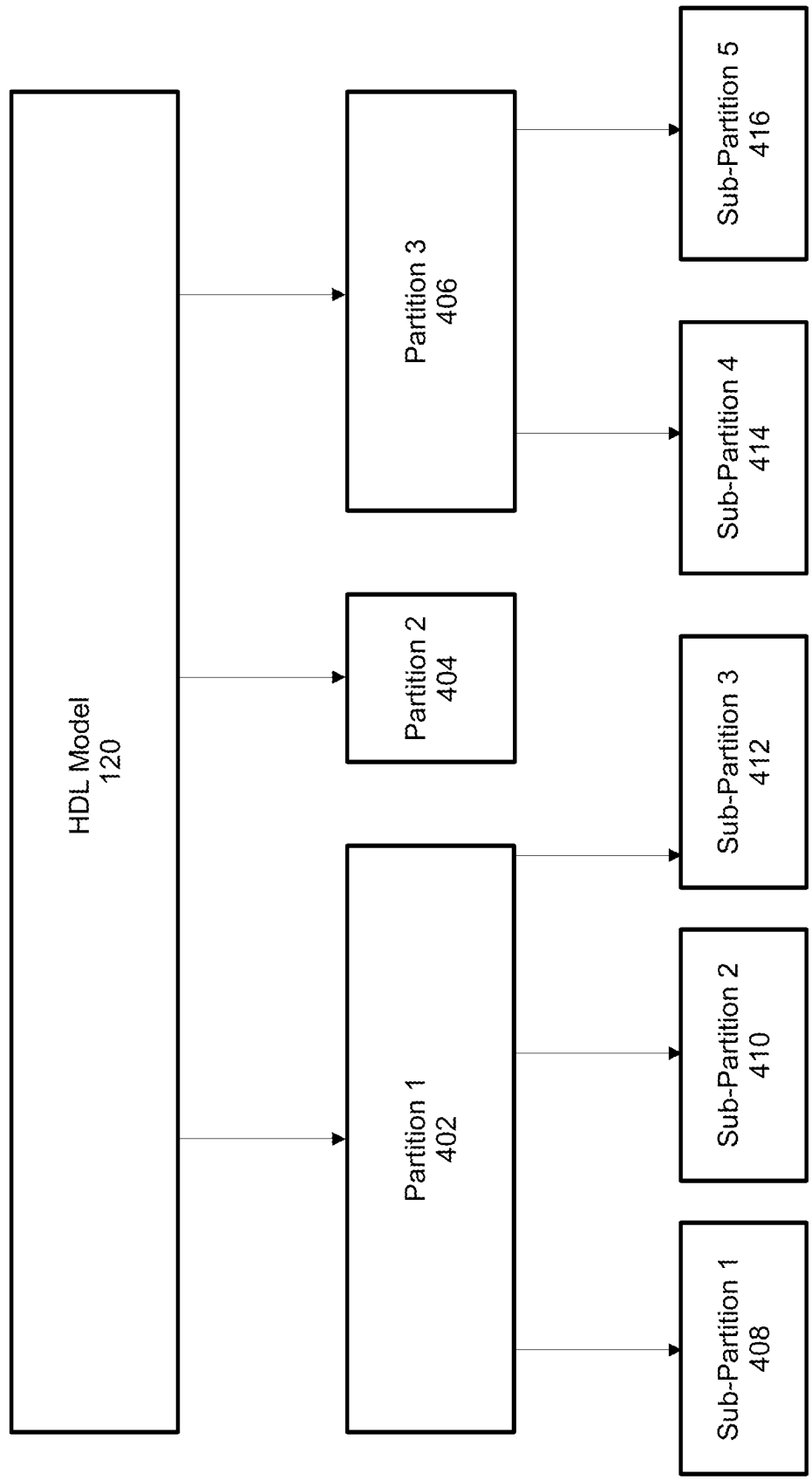

FIGS. 4A and 4B illustrate examples of partitioning the HDL model 120. Referring first to FIG. 4A, the model-partitioning component 142 may determine to create three partitions 402, 404, 406. As mentioned above, the model-partitioning component 142 may determine the partitions based on logical or functional boundaries or units within the HDL model 120; such units may be, for example, execution units, decoders, memories, caches, I/O units, or similar components. The model-partitioning component 142 may enforce a maximum partition size; if a determined partition is greater than this size, the model-partitioning component 142 may separate the partition into two or more partitions. The model-partitioning component 142 may similarly enforce a minimum partition size and may merge partitions of smaller sizes together. The model-partitioning component 142 may further determine the disposition of large data buses and create partitions such that a source of the data bus includes a first partition and a destination of the data bus includes another partition. Any method of determining partitions (and, similarly sub-partitions 408, 410, 412, 414, 416, sub-sub-partitions, etc.) is within the scope of the present disclosure. A given partition may have any number of sub-partitions, including no sub-partitions; similarly, sub-partitions may or may not include sub-sub-partitions, etc. Though FIG. 4A illustrates a fixed number of partitions, dividing an HDL model into any number of partitions, sub-partitions, and sub-sub partitions, etc., is within the scope of the present disclosure.

FIG. 4B illustrates the same partitions 402, 404, 406 and sub-partitions 408, 410, 412, 414, 416 as FIG. 4A but arranged as a hierarchy. The figure illustrates that a given sub-partition (e.g., sub-partition 1 408) may depend upon a partition in a higher level of hierarchy (e.g., partition 1 402) to provide input values (and, in some embodiments, receive output values). As explained in greater detail below, if the partition prediction component 144 determines to cache simulation data corresponding to a sub-partition, it may also determine to cache simulation data corresponding to a partition at a higher level of hierarchy.

In particular, embodiments of the present disclosure may cache simulation data associated with a candidate partition and/or sub-partition to reduce the time associated with resimulating a given partition or sub-partition. For example, absent these embodiments, re-simulation of (e.g.) sub-partition 3 412 may require resimulation of any other partitions that provide initialization values to the storage elements of sub-partition 412 and/or provide input values to the sub-partition 412 during the time steps desired to be resimulated. In this example, such resimulation may require resimulation of some or all portions of the hierarchical parent(s) of sub-partition 3 412, such as partition 1 402.

FIG. 5 illustrates simulation data 500 corresponding to the exemplary partitions of FIGS. 4A-4C. As in FIG. 3C, the values of signals of each partition are determined for a plurality of time steps. Also as described with respect to FIG. 3C, the model-simulation system 102 does not store all of the data depicted in FIG. 5 and stores only the data necessary to determine signal values for a next time step (e.g., it retains the signal values of a current time step only temporarily).

Figure 6B:
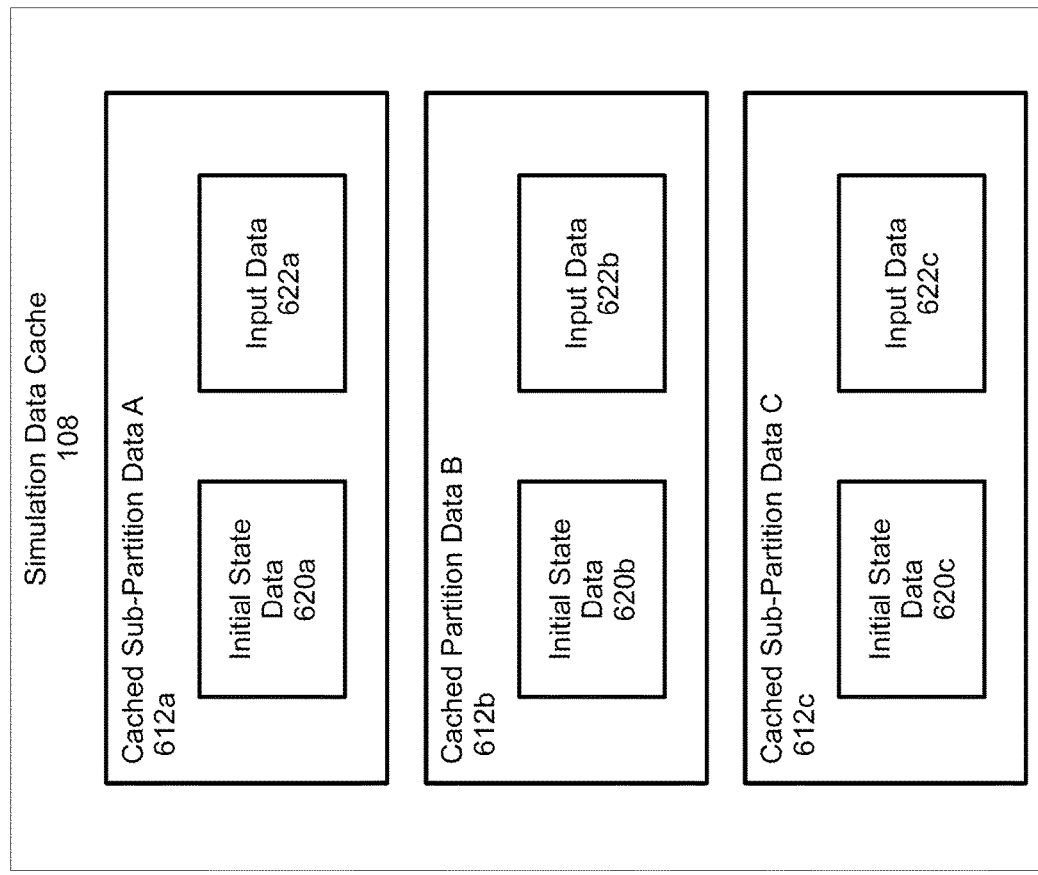

In accordance with embodiments of the present disclosure, FIGS. 6A and 6B illustrate caching data associated with one or more predicted partitions and/or sub-partitions such that, if those partitions and/or sub-partitions are selected for resimulation, the cached values may be used to initialize and run the resimulation. As described herein, with reference first to FIG. 6A, the model-resimulation system 104 may select, for example, data associated with a sub-partition A 612a for caching. This data may include, for example, initial states of storage elements of the partition as well as input data associated with a determined time period (comprising one or more time steps). The model-resimulation system 104 may further determine to cache data associated with one or more levels of hierarchy associated with the determined sub-partition A 612A, such as data associated with the partition B 612b. Any number of partitions may be determined as candidates, and any amount of associated data may be stored. For example, data associated with a sub-partition C 612c may be stored.

FIG. 6B illustrates an example of the simulation data cache 108 (which, again, may be any computer memory storage implemented in software and/or hardware and is not limited to a dedicated hardware cache). The model-resimulation system 104 may store, for a determined candidate partition, data associated with an initial state of some or all storage elements associated with the candidate partition and/or input data to the partition during a determined time period (e.g., a number of time steps). For example, the model-resimulation system 104 may determine to store, for a sub-partition 612a, initial-state data 620a and input data 622a; for a sub-partition 612b, initial-state data 620b and input data 622b; and for a sub-partition C 612c, initial-state data 620c and input data 622c.

FIG. 7 is a block diagram illustrating a user device 110. FIG. 8 is a block diagram illustrating example components of a remote system 800, which may be one or more servers and may include the model-simulation system 102 and/or the model-resimulation system 104. The term "system" as used herein may refer to a traditional system as understood in a system/client computing structure but may also refer to a number of different computing components that may assist with the operations discussed herein. For example, a server may include one or more physical computing components (such as a rack system) that are connected to other devices/components either physically or over a network and is capable of performing computing operations. A server may also include one or more virtual machines that emulates a computer system and is run on one or across multiple devices. A server may also include other combinations of hardware, software, firmware, or the like to perform operations discussed herein. The server may be configured to operate using one or more of a client-system model or other computing techniques.

Multiple servers may be included in the remote system 800, such as one or more servers for emulating operation of an electronic circuit. In operation, each of these server (or groups of servers) may include computer-readable and computer-executable instructions that reside on the respective server, as will be discussed further below. Each of these devices/systems 110/800 may include one or more I/O device interfaces 702/802 for enabling communication over the network 100. Each of these devices/systems 110/800 may include one or more controllers/processors 704/804, which may each include a central processing unit (CPU) for processing data and computer-readable instructions, and a memory 706/806 for storing data and instructions of the respective device. The memories 706/806 may individually include volatile random access memory (RAM), non-volatile read only memory (ROM), non-volatile magneto-resistive memory (MRAM), or other types of memory. Each device/system 110/800 may also include a data-storage component 708/808 for storing data and controller/processor-executable instructions. Each data-storage component 708/808 may individually include one or more non-volatile storage types such as magnetic storage, optical storage, solid-state storage, etc. Each device/system 110/800 may also be connected to removable or external non-volatile memory or storage (such as a removable memory card, memory key drive, networked storage, etc.) through respective input/output device interfaces 702/802. The user device 110 may further include an antenna 712, microphone 714, loudspeaker 716, and/or display 718.

Computer instructions for operating each device/system 110/800 and its various components may be executed by the respective device's/system's controller(s)/processor(s) 704/804, using the memory 706/806 as temporary "working" storage at runtime. The computer instructions may be stored in a non-transitory manner in non-volatile memory 706/806, storage 708/808, and/or an external device(s). Alternatively, some or all of the executable instructions may be embedded in hardware or firmware on the respective device in addition to or instead of software.

Each device/system 110/800 includes input/output device interfaces 702/802. A variety of components may be connected through the input/output device interfaces 702/802, as will be discussed further below. Additionally, each device/system 110/800 may include an address/data bus 710/810 for conveying data among components of the respective device/system. Each component within a device/system 110/800 may also be directly connected to other components in addition to (or instead of) being connected to other components across the bus 710/810.

The device 110 may include input/output device interfaces 702 that connect to a variety of components such as an audio output component, a wired headset, or a wireless headset, or other component capable of outputting audio. The device 110 may also include an audio capture component. The audio capture component may be, for example, the microphone 1014 or array of microphones, a wired headset, or a wireless headset, etc.

Via antenna(s) 712, the input/output device interfaces 702 may connect to one or more networks 100 via a wireless local area network (WLAN) (such as Wi-Fi) radio, Bluetooth, or wireless network radio, such as a radio capable of communication with a wireless communication network such as a Long Term Evolution (LTE) network, WiMAX network, 3G network, 4G network, 5G network, etc. A wired connection such as Ethernet may also be supported. Through the network(s) 100, the system may be distributed across a networked environment. The I/O device interface 702/802 may also include communication components that allow data to be exchanged between devices such as different physical systems in a collection of systems or other components.

Referring to FIG. 10, as noted above, multiple devices 110 may be employed in a single system. In such a multi-device system, each of the devices may include different components for performing different aspects of the system's processing. The multiple devices may include overlapping components. The components of the device 110 or the system 800, as described herein, are illustrative, and may be located as a stand-alone device or may be included, in whole or in part, as a component of a larger device or system.

The network 100 may further connect user devices 110 such as a laptop computer 110a, a desktop computer 110b, a tablet computer 110c, and/or a smart phone 110d through a wireless service provider, over a Wi-Fi or cellular network connection, or the like. Other devices may be included as network-connected support devices, such as a remote system 800. The support devices may connect to the network 100 through a wired connection or wireless connection. Networked devices 110 may capture audio using one-or-more built-in or connected microphones 1014 or audio-capture devices, with processing performed by components of the same device 110 or another device/system 110/800 connected via network 100. The concepts disclosed herein may be applied within a number of different devices and computer systems.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers will understand that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage media may be implemented by a volatile computer memory, non-volatile computer memory, hard drive, solid-state memory, flash drive, removable disk or other media. In addition, components of one or more of the components and engines may be implemented as in firmware or hardware.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements or steps. Thus, such conditional language is not generally intended to imply that features, elements, or steps are in any way required for one or more embodiments or that one or more embodiments necessarily include logic for deciding, with or without other input or prompting, whether these features, elements, or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y, Z," unless specifically stated otherwise, is understood with the context as used in general to present that an item, term, etc., may be either X, Y, or Z, or any combination thereof (e.g., X, Y, or Z). Thus, such disjunctive language is not generally intended to, and should not, imply that certain embodiments require at least one of X, at least one of Y, or at least one of Z to each be present.

As used in this disclosure, the term "a" or "one" may include one or more items unless specifically stated otherwise. Further, the phrase "based on" is intended to mean "based at least in part on" unless specifically stated otherwise.

What is claimed is:

1. A computer-implemented method for resimulating operation of a portion of a model representing an electronic circuit, the method comprising:
   processing a hardware-description-language (HDL) description of the electronic circuit to determine a first partition comprising a first representation of a first group of circuit elements of the electronic circuit;
   determining that the first partition is a candidate for resimulation;
   receiving, from a first HDL model corresponding to the HDL description, first simulation data corresponding to values of signals in the first partition;

based on determining that the first partition is a candidate for resimulation, storing, in a cache memory, the first simulation data;
receiving an indication of a request to resimulate the first partition;
processing, using the first simulation data, a second HDL model corresponding to the first partition to determine second simulation data; and
displaying, on a computer display, at least a portion of the second simulation data.

2. The method of claim 1, further comprising:
receiving a second request to resimulate a second partition;
determining that at least a portion of the second simulation data corresponds to the second partition; and
processing, using the second simulation data, a third HDL model corresponding to the second partition.

3. The method of claim 1, wherein determining that the first partition is a candidate for resimulation comprises processing a list of requested signals.

4. The method of claim 1, wherein determining that the first partition is a candidate for resimulation comprises processing an interaction of a user with a user device.

5. A system comprising:
at least one processor; and
at least one memory including instructions that, when executed by the at least one processor, cause the system to:
process a hardware-description-language (HDL) description of an electronic circuit to determine a first partition comprising a first representation of a first group of circuit elements of the electronic circuit;
determine that the first partition is a candidate for resimulation;
receive, from a first HDL model corresponding to the HDL description, first simulation data corresponding to values of signals in the first partition;
based on determining that the first partition is a candidate for resimulation, store, in a cache memory, the first simulation data;
receive an indication of a request to resimulate the first partition;
process, using the first simulation data, a second HDL model corresponding to the first partition to determine second simulation data; and
display, on a computer display, at least a portion of the second simulation data.

6. The system of claim 5, the memory further including instructions that, when executed by the at least one processor, further cause the system to:
receive a second request to resimulate a second partition;
determine that at least a portion of the second simulation data corresponds to the second partition; and
process, using the second simulation data, a third HDL model corresponding to the second partition.

7. The system of claim 5, wherein determining that the first partition is a candidate for resimulation comprises processing a list of requested signals.

8. The system of claim 5, wherein determining that the first partition is a candidate for resimulation comprises processing an interaction of a user with a user device.

* * * * *